(12) United States Patent
Sundaram

(10) Patent No.: US 10,076,021 B1
(45) Date of Patent: Sep. 11, 2018

(54) METHOD, DEVICE AND SYSTEM FOR FACILITATING HEAT DISSIPATION FROM A CIRCUIT ASSEMBLY

(71) Applicant: Intel Corporation, Santa Clara, CA (US)

(72) Inventor: Arvind Sundaram, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/486,194

(22) Filed: Apr. 12, 2017

(51) Int. Cl.
*H05K 1/02* (2006.01)
*H05K 1/18* (2006.01)
*H05K 7/20* (2006.01)
*G06F 1/20* (2006.01)

(52) U.S. Cl.
CPC ............ *H05K 1/0207* (2013.01); *G06F 1/203* (2013.01); *H05K 1/18* (2013.01); *H05K 7/20963* (2013.01); *H05K 2201/083* (2013.01)

(58) Field of Classification Search
CPC .. H05K 2201/083; H05K 1/0207; H05K 1/18; H05K 7/20963; G06F 1/203
See application file for complete search history.

(56) References Cited

U.S. PATENT DOCUMENTS

2014/0355218 A1* 12/2014 Vinciarelli ........... H01R 43/205
361/728

* cited by examiner

*Primary Examiner* — James Wu
(74) *Attorney, Agent, or Firm* — Schwabe, Williamson & Wyatt, P.C.

(57) ABSTRACT

Techniques and mechanisms for providing efficient heat dissipation by a circuit assembly. In an embodiment, the circuit assembly includes an inductor and a packaged device coupled thereto, where the inductor forms heat dissipation structures on various respective sides of a ferromagnetic body. The packaged assembly includes a circuit board disposed in a mold material, where a metal core of the circuit board is thermally coupled to transfer heat from one or more circuit components of the packaged device to the inductor via one or more conductors extending from the package mold. In another embodiment, portions of the metal core have different respective vertical spans which contribute to different thermal conductivity characteristics across various regions of the circuit board.

20 Claims, 11 Drawing Sheets

METHOD, DEVICE AND SYSTEM FOR FACILITATING HEAT DISSIPATION FROM A CIRCUIT ASSEMBLY

RELATED APPLICATIONS

This patent application is related to concurrently filed U.S. patent application Ser. No. 15/486,167, titled "INDUCTOR WITH INTEGRATED HEAT DISSIPATION STRUCTURES," filed on Apr. 12, 2017, by Arvind Sundaram, and to concurrently filed U.S. patent application Ser. No. 15/486,171, titled "MULTI-LEVEL LEAD FRAME STRUCTURES AND METHOD OF PROVIDING SAME," filed on Apr. 12, 2017, by Arvind Sundaram, and to concurrently filed U.S. patent application Ser. No. 15/486,174, titled "CIRCUIT BOARD STRUCTURES FOR THERMAL INSULATION AND METHOD OF MAKING SAME," filed on Apr. 12, 2017, by Arvind Sundaram, all of which are assigned to the assignee of the presently claimed subject matter and herein incorporated by reference.

BACKGROUND

1. Technical Field

Embodiments of the present invention generally relate to circuit assemblies and more particularly, but not exclusively, to structures for dissipating heat from a packaged device.

2. Background Art

Microprocessors and other electronic circuit components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment, which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

As successive generations of integrated circuit systems continue to scale down in size, and increase in capability, there is expected to be an increasing premium placed on incremental improvements to the dissipation of heat by such systems.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for dissipating heat from an assembly of circuit devices (for brevity, referred to herein as a "circuit assembly"). In one example, embodiment, a circuit assembly includes an inductor and a packaged device coupled thereto, where the inductor forms heat dissipation structures (also referred to herein as "fin structures" or, for brevity, "fins") on various respective sides of a ferromagnetic body. The packaged assembly may comprise a circuit board disposed in a package mold material, where a metal core of the circuit board is thermally coupled to transfer heat from one or more circuit components of the packaged device to the inductor via one or more conductors extending from the package mold. In some embodiments, an arrangement of fin structures may contribute to a low-profile circuit assembly—e.g., to provide a space efficient and heat efficient power transformer.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a circuit assembly having structures to facilitate heat dissipation.

Figure 1:
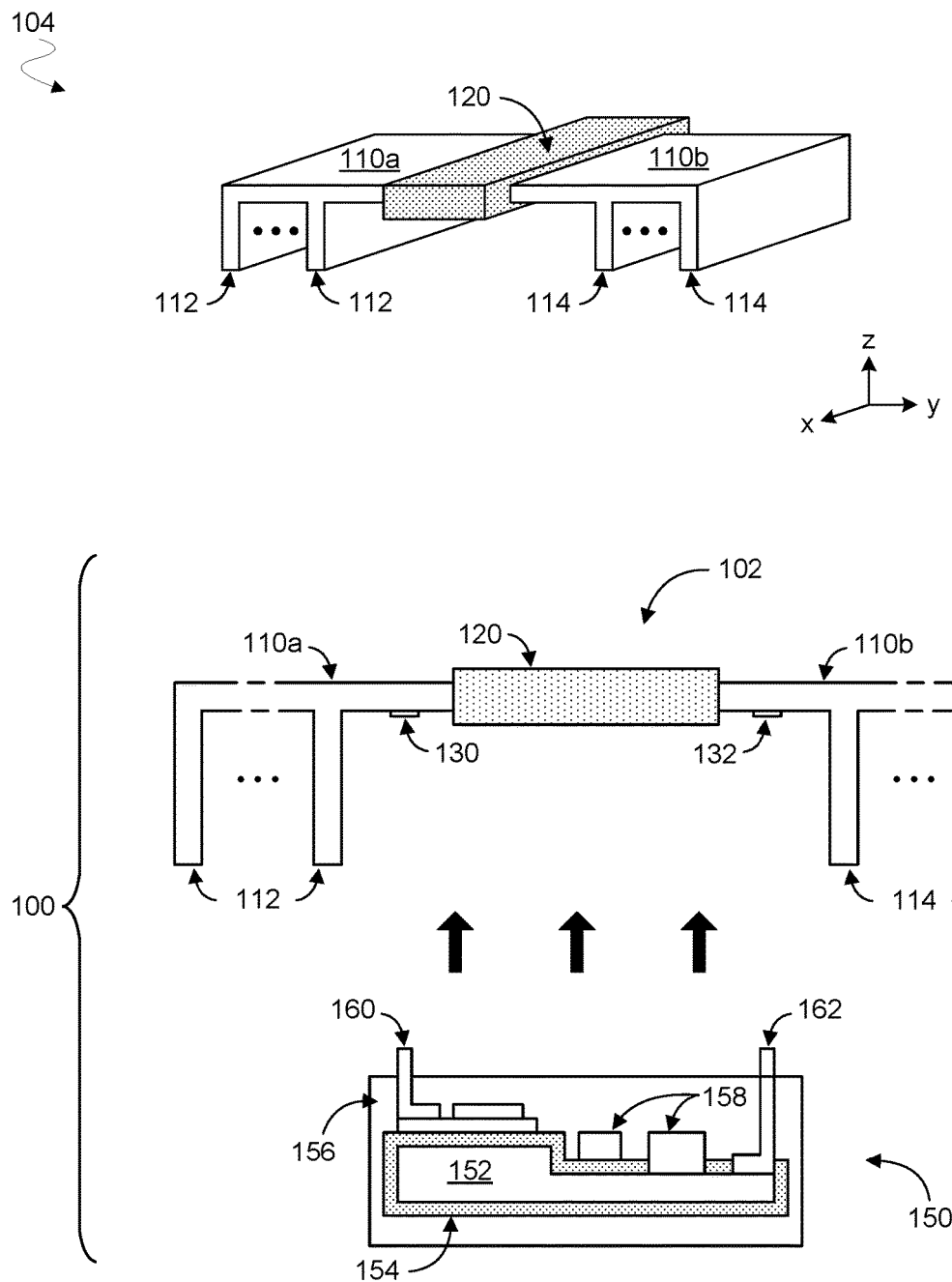
FIG. 1 shows views of a circuit assembly including structures to facilitate heat dissipation according to an embodiment.

FIG. 1 shows an exploded view of a circuit assembly 100 including structures to provide efficient heat dissipation according to an embodiment. Circuit assembly 100 is one example of an embodiment wherein an inductor is coupled to a packaged device, wherein the inductor comprises a ferromagnetic body and a first conductor extending therethrough (the first conductor forming fin structures on one or more sides of the ferromagnetic body), wherein the packaged device includes circuit board, a metal core of which is thermally coupled to transfer heat to the first conductor.

In the illustrative embodiment shown, circuit assembly 100 includes an inductor 102 and a packaged device 150 (where a perspective view 104 of inductor 102 is also provided in FIG. 1). Inductor 102 may comprise a ferromagnetic body 120 and a first conductor extending therethrough—e.g., wherein the first conductor includes conductive portions 110a, 100b each extending from a respective side of ferromagnetic body 120. Another portion (not shown) of the first conductor may couple portions 110a, 100b to one another, wherein ferromagnetic body 120 extends around that other portion. Such a portion of a first conductor is referred to herein as a "median conductor portion."

Portions 110a, 110b may variously extend each from a respective side of ferromagnetic body 120, wherein heat dissipation structures (or "fin structures") are variously formed by, or extend each from, a respective one of portions 110a, 110b. In the illustrative embodiment shown, one or more fin structures (such as the illustrative two or more fin structures 112 shown) extend from a generally planar structure of conductive portion 110a. One or more other fin structures (such as the illustrative two or more fin structures 114 shown) may similarly extend from a generally planar structure of conductive portion 110b. Although some embodiments are not limited in this regard, one or more sides of conductive portions 110a, 100b and/or of the median conductor portion may extend in a plane from which extend some or all of fin structures 112, 114.

Inductor 102 may include structures to facilitate coupling to packaged device 150. For example, portions 110a, 110b may form, or couple to, respective terminals 130, 132 which are each to be soldered or otherwise coupled to a corresponding one of conductors 160, 162 extending from a package mold 156 of packaged device 150. Terminals 130, 132 (e.g., each comprising a respective pin, pad, ball, pad, or other such conductive contact) may facilitate communication of a respective signal or voltage each with a corresponding one of conductors 160, 162. Some embodiments are not limited with respect to a particular functionality of circuitry that might be included in packaged device 150.

In some embodiments, one or both of conductors 160, 162 function as a path by which heat is transferred between packaged device 150 and inductor 102—e.g., where such heat is dissipated at least in part with fin structures 112, 114. By way of illustration and not limitation, for one or each of terminals 130, 132, the terminal may have a width (x-axis dimension) which is at least two times—e.g., at least three times and, in some embodiments, at least five times—its length (y-axis dimension). Similarly, for one or each of conductors 160, 162, the conductor may have a width (x-axis) which is at least two times its length (y-axis). In providing additional contact surfaces between terminal 130 and conductor 160 (and/or between terminal 132 and conductor 162), some embodiments support additional heat transfer between inductor 102 and packaged device 150 via one or both of conductors 160, 162.

In an embodiment, the first conductor—e.g., including copper (e.g., plated with silver or gold), aluminum and/or any of a variety of other metals or alloys thereof—is stamped, molded or otherwise shaped into the form shown. Ferromagnetic body 120 may comprise any of a variety of one or more materials—e.g., including, but not limited to, nickel zinc (NiZn), magnesium zinc (MgZn), a ferrite, perovskite, zirconate, titanate or cobalt based magnetic material or the like—which exhibit low core loss, low hysteresis and/or high flux capability (e.g., at frequencies in a range of 5 Mhz to 50 Mhz). Formation of ferromagnetic body 120 around the first conductor may include sintering or otherwise transforming the one or more materials—e.g., from a powder or other granular state into a single rigid body. Fabrication of inductor 102 may use one or more materials and/or operations adapted, for example, from conventional techniques for manufacturing circuit elements. The particular details of such conventional techniques are not detailed herein to avoid obscuring certain features of various embodiments.

In one example embodiment, an overall width (x-axis) of the first conductor may be in a range of 8 millimeters (mm) to 12 mm—e.g., wherein an overall length (y-axis) of the first conductor is also in a range of 8 mm to 12 mm. In such an embodiment, a z-axis thickness of the median conductor portion (which extends through ferromagnetic body 120) may, for example, be in a range of 0.05 mm to 0.1 mm (e.g., in a range of 0.1 mm to 0.2 mm). Some or all of fin structures 112, 114 may each have a respective z-axis height which is in a range of 1.0 mm to 2.5 mm—e.g., wherein such fin structures each have a respective y-axis thickness in a range of 0.05 mm to 0.1 mm. Alternatively or in addition, a thickness (z-axis) of ferromagnetic body 120 on one side of the median conductor portion may, for example, be in a range of 0.5 mm to 1.0 mm—e.g., where an overall thickness of ferromagnetic body 120 is in a range of 1.5 mm to 3.0 mm. In such an embodiment, ferromagnetic body 120 may, for example, have a width (x-axis) in a range of 6 mm to 12 mm and/or a length (y-axis) in a range of 4 mm to 10 mm. However, such dimensions of the first conductor and fin structures 112, 114 are merely illustrative, and may vary in other embodiments according to implementation specific details.

Inductor 102 may include more, fewer and/or differently configured fin structures, in other embodiments. For example, in the illustrative embodiment represented by FIG. 1, fin structures 112, 114 all extend in a same direction from the same side of a generally planar structure formed in part by portions 110a, 110b. Moreover, as shown, fin structures 112, 114 also extend each at a right angle from such a side of the planar structure. However, some embodiment may vary, for example, with respect to the total number of one or more fin structures on any given side of ferromagnetic body 120, the respective side or sides of the first conductor from which some or all such fin structures variously extend, the respective angles at which some or all fin structures may variously extend and/or the like.

In the example embodiment of circuit assembly 100, packaged device 150 includes a circuit board comprising a metal core 152 and an insulator material 154 disposed on metal core 152. The circuit board may have disposed thereon one or more circuit components (such as the illustrative circuit components 158 shown) to operate in conjunction with inductor 102. For example, circuit components 158—e.g., including one or more packaged integrated circuit chips, discrete circuit elements, and/or the like—may operate to communicate a voltage or a signal with inductor 102. Metal core 152 may be thermally coupled to transfer heat generated by one or more of circuit components 158. By way of illustration and not limitation, a circuit component 158 may be directly coupled to metal core 152 and/or to one of conductors 160, 162—e.g., wherein a dimensioning of the one of conductors 160, 162 exceeds that which is sufficient to communicate a signal or a voltage between packaged device 150 and inductor 102.

Figure 2:
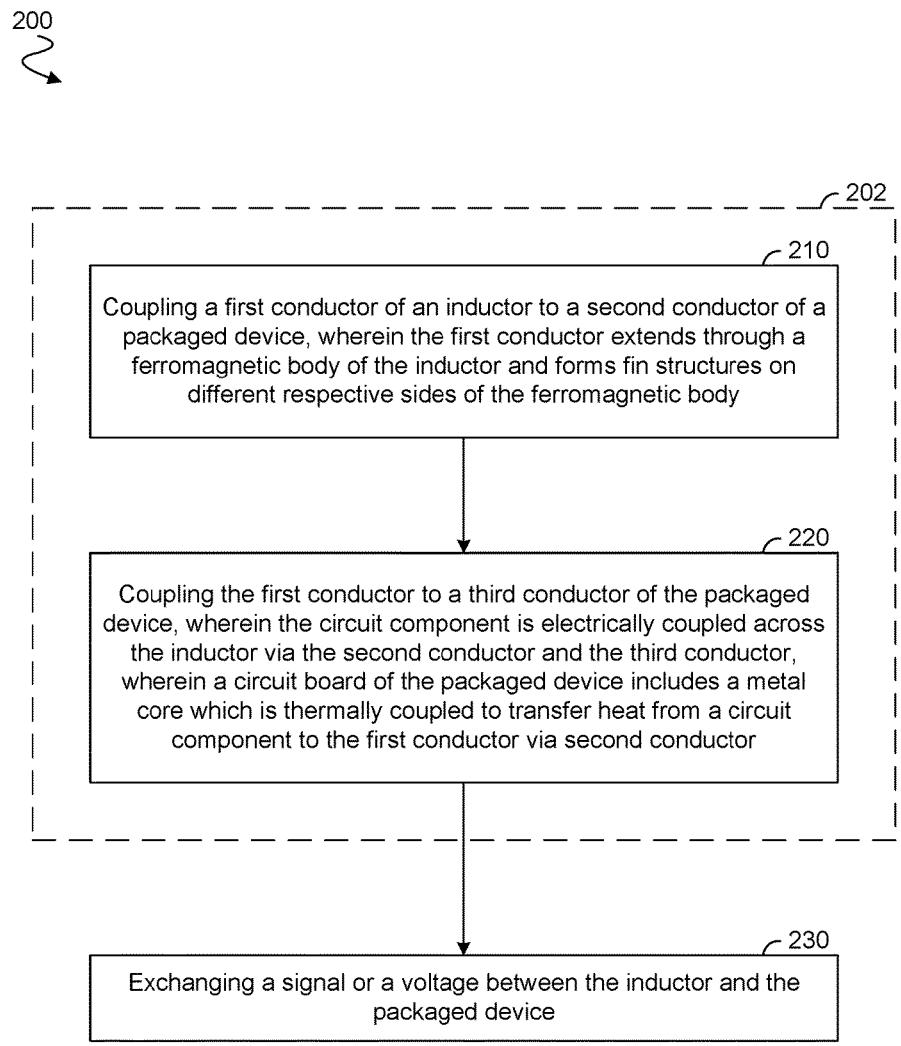
FIG. 2 is a flow diagram illustrating elements of a method to provide functionality of a circuit assembly according to an embodiment.

FIG. 2 shows features of a method 200 to provide a path for heat dissipation in a circuit assembly according to an embodiment. Method 200 may be performed to provide structures of circuit assembly 100, for example. FIGS. 3A-3G show respective stages 300a-300g of processing to fabricate, according to an embodiment, structures of a circuit assembly such as circuit assembly 100. To illustrate certain features of various embodiments, method 200 is described herein with respect to processing to assembly circuit structures such as those shown in stages 300a-300g. However, such description may be extended to apply to processing which provides any of a variety of additional or alternative circuit assemblies having features described herein.

Method 200 may include operations 202 to couple an inductor and a packaged device. Although some embodiments are not limited in this regard, operations 202 may additionally or alternatively include processing to fabricate one or both of the inductor and the packaged device. For example, referring now to FIGS. 3A-3E, stages 300a-300e illustrate operations to fabricate a packaged device having features of packaged device 150. As shown in stage 300a, one or more circuit components (such as the illustrative components 301 shown) may be coupled to a circuit board 303—e.g., as part of processing to fabricate a packaged device which includes components 301 and circuit board 303. In one example embodiment, circuit components 301 include circuitry to operate in a power transformer—e.g., comprising integrated circuitry such as high-electron-mobility transistors, a redriver component and/or the like. However some embodiments are not limited to a particular functionality that might be provided by circuit components 301.

Although some embodiments are not limited in this regard, some of all of components 301 may be variously interconnected with circuit board 303 using a three-dimensional lead frame 302. In the illustrative embodiment shown, lead frame 302 includes a frame portion 334 and various branch portions (such as the illustrative branch portions 330, 332 shown) which variously extend from frame portion 334. Opposite sides of frame portion 334 may each extend in parallel with a plane (e.g., the x-y plane of the xyz coordinate system shown), wherein one or more of branch portions 330, 332 variously extend at least in part in a region which is above such opposite sides or below such opposite sides. Lead frame 302 may include copper, gold, aluminum, silver and/or any of a variety of other metals used to interconnect integrated circuitry, discrete circuit elements, etc. Although some embodiments are not limited in this regard, a length (x-axis dimension) of lead frame 302 may be in a range of 2 centimeters (cm) to 6 cm—e.g., wherein a width (y-axis dimension) of lead frame 302 is in a range of 2 cm to 6 cm and/or an overall thickness (z-axis dimension) of frame portion 334 may be in a range of 3 millimeters (mm) to 15 mm. However, such lead frame dimensions are merely illustrative, and may vary in different embodiments according to implementation-specific details. In other embodiments, components 301 and circuit board 303 are interconnected using conductive structures other than those of any three-dimensional lead frame.

Some or all of branch structures 330, 332 may be variously soldered or otherwise electrically coupled each to a corresponding conductive contact of circuit board 303 or a corresponding conductive contact of a circuit component disposed on circuit board 303. Alternatively of in addition, one or more of circuit components 301 may be soldered or otherwise coupled to a metal core of the circuit board—e.g., directly or via one of branch structures 330, 332. Such components may be variously disposed on surfaces (e.g., including the illustrative surfaces 342, 344, 346, 348 shown) having different respective z-height levels. The particular number, sizes, height and/or other configuration of the multi-level surfaces 342, 344, 346, 348 is merely illustrative, and may vary in different embodiments according to implementation-specific details. In providing branch portions which variously extend each in a respective direction away from an x-y plane, lead frame 302 may enable the formation of leads which are routed onto, over or below (e.g., rather than around) one or more other structures in such an x-y plane.

Figure 3A:
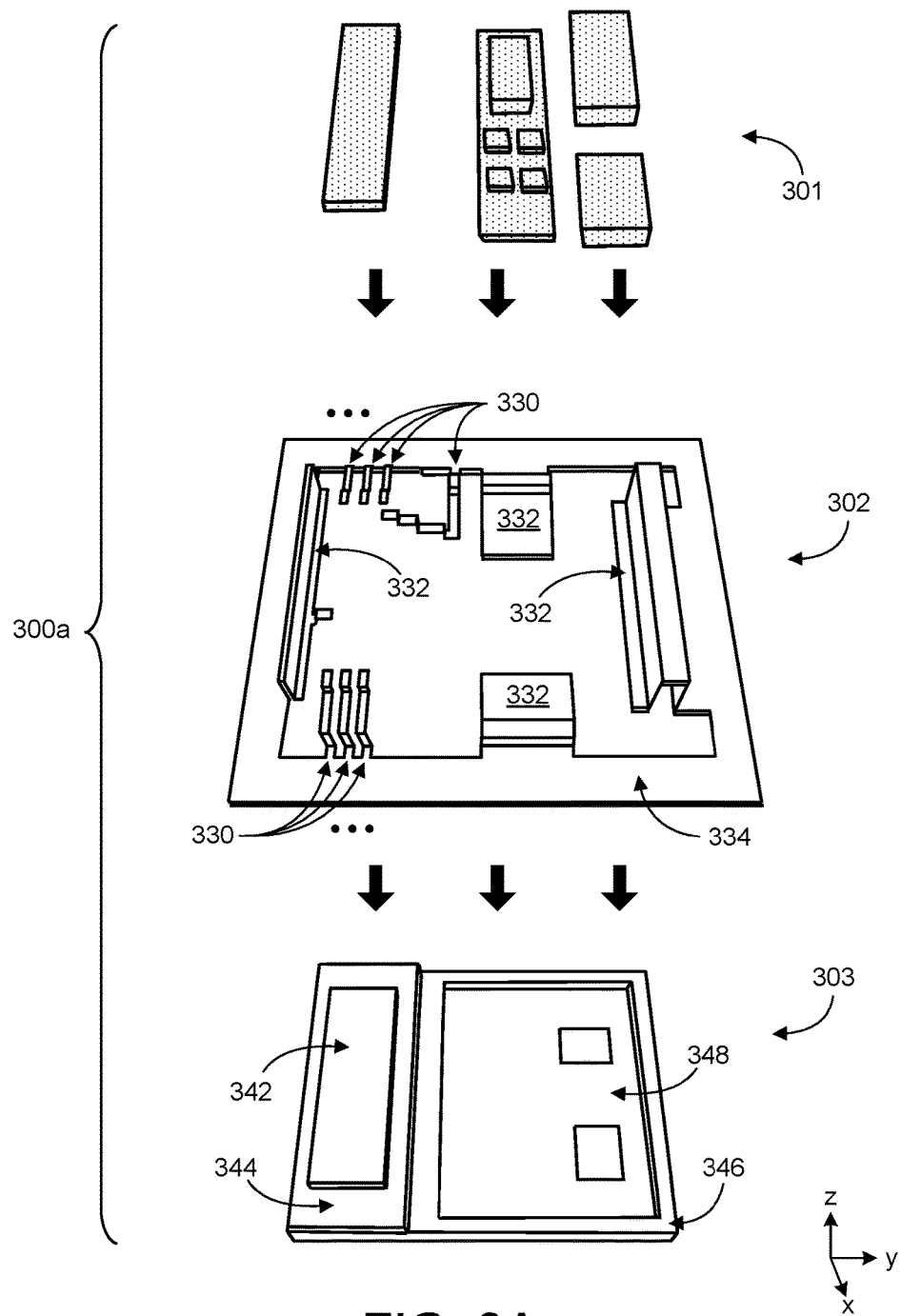
FIGS. 3A-3G show respective structures each during a corresponding stage of processing to fabricate a circuit assembly according to an embodiment.
Figure 3B:
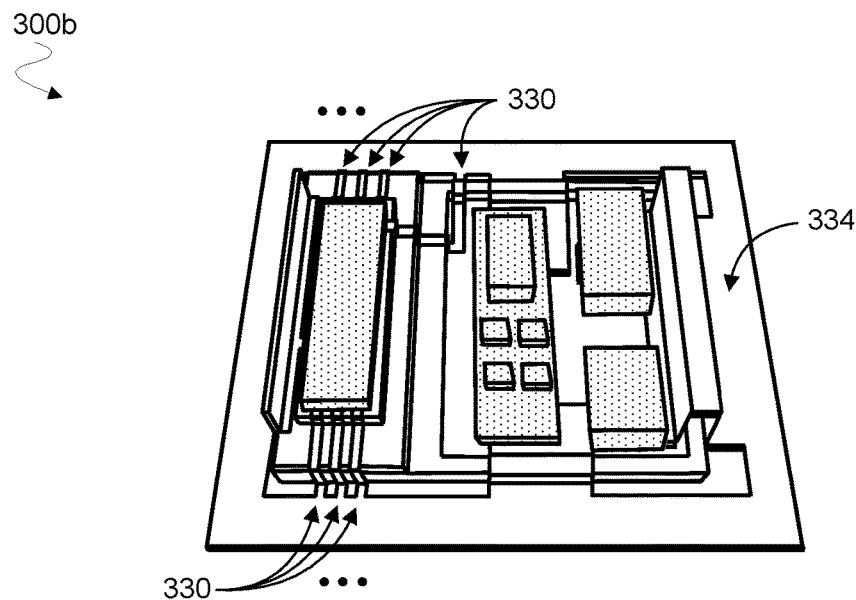

A resulting assembly of circuit components 301, lead frame 302 and circuit board 303 is shown at stage 300b of FIG. 3B. Although some embodiments are not limited in this regard, one or more of components 301 may be disposed in a recess structure formed by a portion of circuit board 303. In such an embodiment, the recess structure may function as a reservoir to contain an insulator material. For example, as illustrated at stage 300c in FIG. 3C, an insulator material 336 may provide improved thermal insulation between multiple components 301 disposed in the same recess structure of circuit board 303.

Figure 3C:
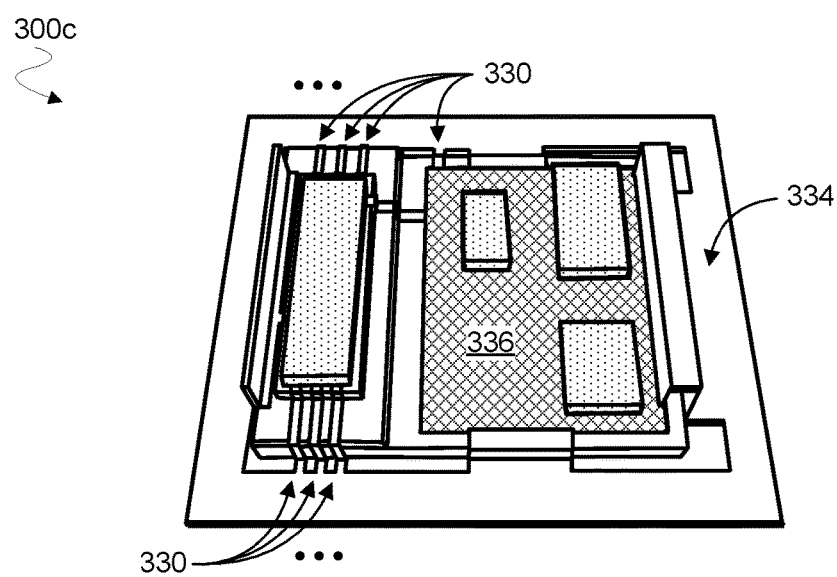
Figure 3D:
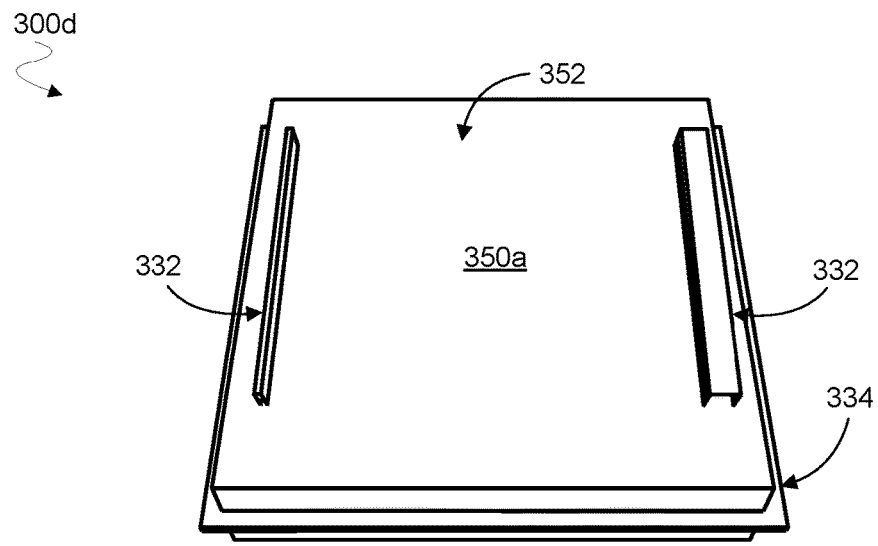

A packaged device 350a (shown at stage 300d shown in FIG. 3D) may be formed by disposing a mold material on and/or around at least a portion of the assembly shown in FIG. 3C. Although some embodiments are not limited in this regard, one or more structures of the lead frame 302 may extend from the package material of packaged device 350a. For example, some or all of frame portion 334 may extend from one or more side surfaces of the packaged material—e.g., wherein portions of branch structures 332 extend from a top surface 352 of the package material.

Figure 3E:
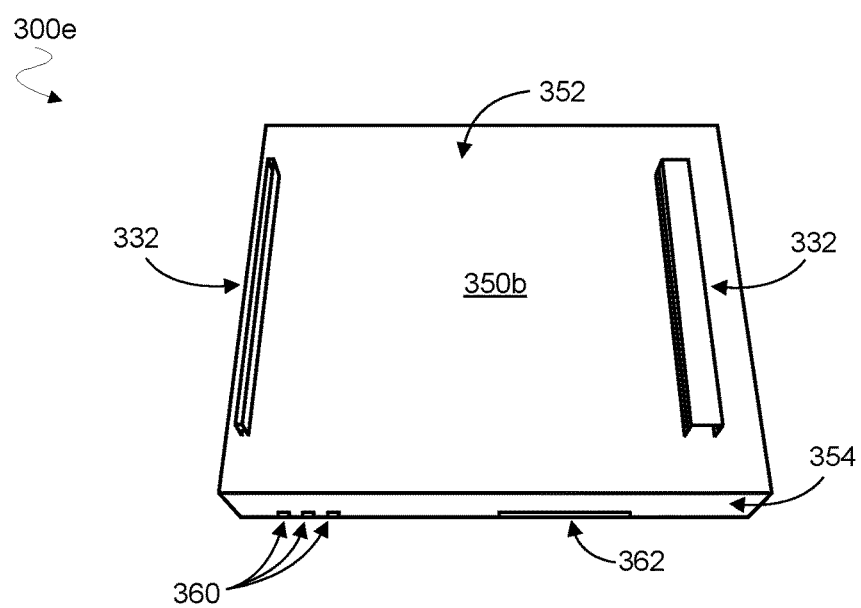

As shown at stage 300e of FIG. 3E, portions of the packaged device 350a may be selectively cut, ground or otherwise removed to form a smaller packaged device 350b. Such removal may variously form leads each from a respective one of branch structures 330, 332. By way of illustration and not limitation, dicing and/or other cutting of packaged device 350a may expose a sidewall 354 of packaged device 350b, the sidewall 354 including end portions 360 of leads which are each formed from a respective one of branch structures 330. Alternatively or in addition, such cutting and/or other removal may expose end portions 362 of leads variously formed each from a respective one of branch structures 332. In some embodiments, a bottom surface of packaged device 350b (opposite top surface 352) may have formed therein respective exposed portions of one or more other leads.

The resulting packaged device 350b formed at stage 300e may include a package mold forming a sidewall 354 which extends around a periphery of packaged device 350b. The packaged device 350b may further comprise integrated circuitry disposed in the package mold, wherein a plurality of leads are each coupled to a respective conductive contact of the integrated circuitry. Respective distal ends of the plurality of leads—e.g., including end portions 360, 362 shown—may each extend to sidewall 354 in a region which is between a first plane and a second plane (corresponding, for example, to a top surface and a bottom surface of frame portion 334). In such an embodiment, other respective portions of one or more such leads may extend outside of the region between the first plane and the second plane. Although some embodiments are not limited in this regard, the respective distal ends of the plurality of leads may each have the same surface texture—e.g., wherein the surface texture is a residual artifact of cutting, grinding, polishing and/or other processing to separate the leads from the frame portion 334 of the lead frame 302. Such a surface texturing may also be present at adjoining regions of sidewall 354, for example. In some embodiments, the plurality of leads each have the same smallest cross-sectional (z-axis) height—e.g., wherein cross-sections of the plurality of leads each have a respective rectilinear shape.

Referring again to FIG. 2 and method 200, operations 202 may include, at 210, coupling a first conductor of an inductor to a second conductor of a packaged device (e.g., packaged device 350b), wherein the first conductor extends through a ferromagnetic body of the inductor and wherein the first conductor forms fin structures on different respective sides of the ferromagnetic body. For example, the first conductor may comprise a first conductive portion and a second conductive portion (e.g., portions 110a, 110b) each extending from the ferromagnetic body, wherein a third conductive portion of the conductor extends through the ferromagnetic body between the first conductive portion and the second conductive portion. In such an embodiment, the first conductive portion and the second conductive portion may each form respective fin structures.

The packaged device may, in an embodiment, include a circuit board disposed in a mold and a circuit component disposed on the circuit board—e.g., wherein the second conductor and a third conductor of the packaged device each extend from the package mold. In such an embodiment, operations 202 may further comprise, at 220, coupling the first conductor to the third conductor, wherein the circuit component is electrically coupled across the inductor via the second conductor and the third conductor. The circuit board may comprise a metal core including a first core portion and a second core portion, wherein an average thickness of all of the first core portion and is at least two times an average thickness of all of the second core portion, wherein the metal core is thermally coupled to transfer heat from the circuit component to the first conductor via second conductor. The first core portion and the second core portion may each comprise at least five percent (and, in some embodiments, at least ten percent) of the metal core by volume.

Figure 3F:
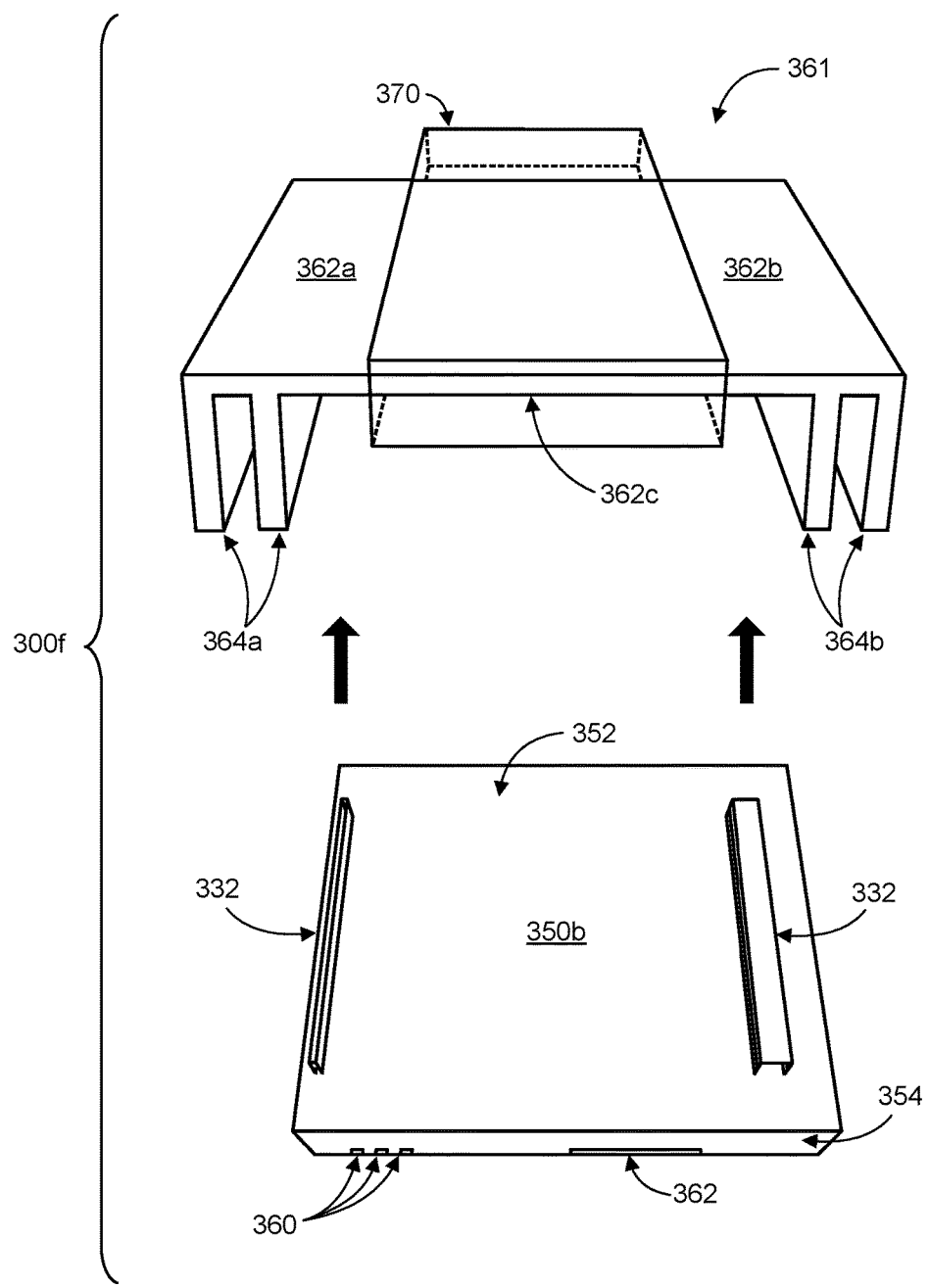

Referring to stage 300f shown in FIG. 3F, the packaged device 350b formed at stage 300e may be coupled to an inductor 361 which, for example, has features of inductor 102. Inductor 361 may comprise a ferromagnetic body 370 and a conductor including portions 362a, 362b, 362c—e.g., wherein portion 362c extends in ferromagnetic body 370 and portions 362a, 362b variously extend from respective sides of ferromagnetic body 370. In such an embodiment, portions 362a, 362b may form respective heat dissipation structures, such as the illustrative fin structures 364a, 364b shown. To provide a space efficient, low form-factor circuit assembly, fin structures 364a, 364b may extend in a direction toward packaged device 350b—e.g., wherein some or all of fin structures 364a, 364b variously overlap vertically with packaged device 350b. Space efficiency may be additionally or alternatively facilitated by packaged device 350b coupling to inductor 361 via terminals (such as terminal 130, 132) which are variously disposed each between ferromagnetic body 370 and a respective one of fins 364a or fins 364b. Ferromagnetic body 370 is transparent in FIG. 3F merely to illustrate features disposed therein.

Figure 3G:
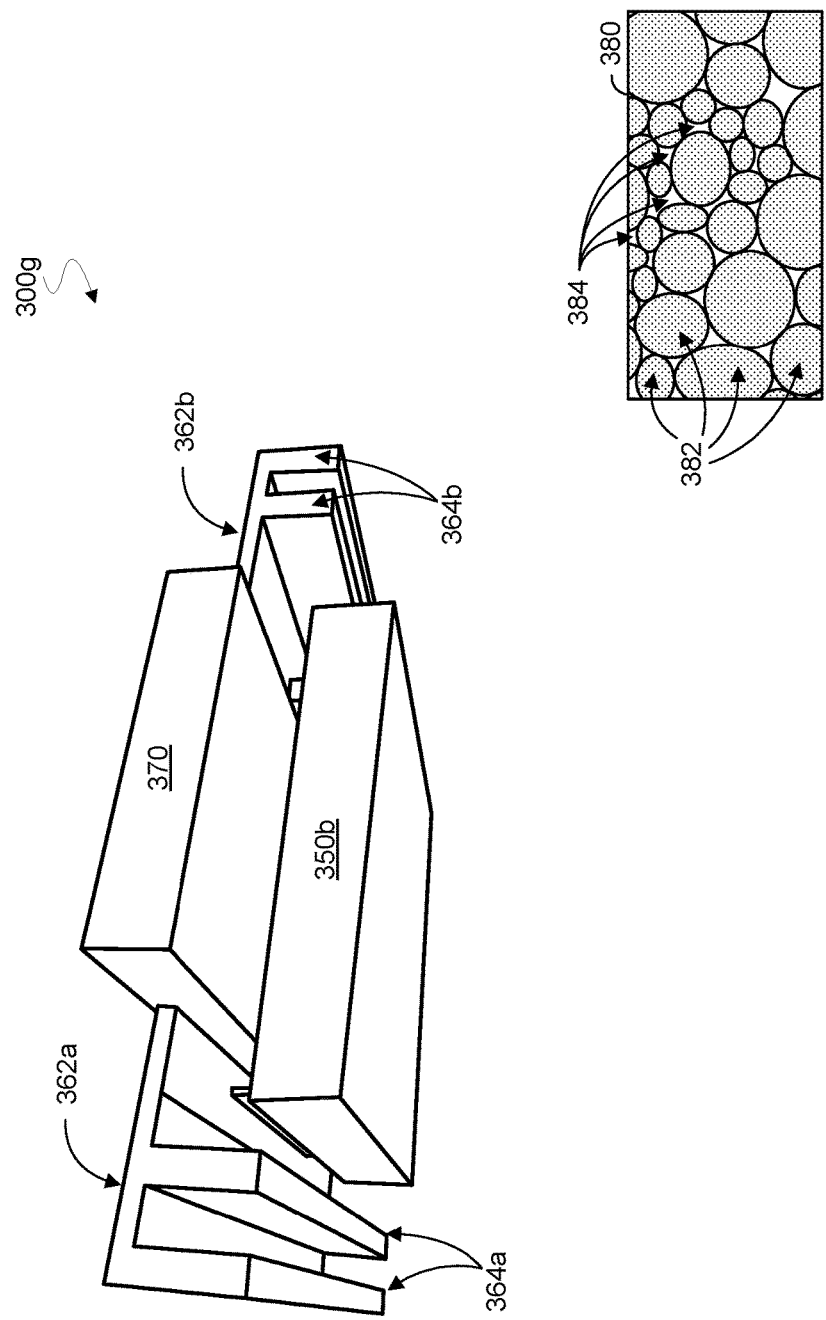

The coupling at 210 and 220 may, for example, comprise coupling the exposed lead portions 332 of packaged device 350b—e.g., corresponding functionally to conductors 160, 162—each to a corresponding terminal (not shown) which is formed on a respective one of conductive portions 362a, 362b. A circuit assembly resulting from such coupling is provided at stage 300g, as shown in FIG. 3G. In some embodiments, method 200 may additionally or alternatively include operating a circuit assembly such as one which is provided by operations 202. For example, method 200 may include, at 230, exchanging a signal or a voltage between the inductor and the packaged device.

Physical properties of ferromagnetic body 370 may facilitate inductance to provide high frequency signaling. For example, as illustrated by the cross-sectional detail view in inset 380 of FIG. 3G, ferromagnetic body 370 may include particles, granules and/or other such clusters of ferromagnetic material that variously extend around gap regions in ferromagnetic body 370. Such clusters (referred to herein as "ferromagnetic node structures") may be variously melted or otherwise bonded to one another—e.g., by a sintering process. For example, these nodes may include distinct ferromagnetic particles which variously adjoin one another and/or may include ferromagnetic structures which are melted together at their respective surfaces. An interface between one ferromagnetic node structure and an adjoining ferromagnetic node structure may be indicated, for example, by a local minimum in the cross-sectional area of any ferromagnetic material between the node structures.

In the illustrative embodiment shown by inset 380, ferromagnetic body 370 comprises ferromagnetic node structures 382 which variously adjoin and extend around gap regions 384. Gap regions 384 may variously have disposed therein air and/or a binding material used to facilitate a sintering or other process to bond ferromagnetic particles. Such a binding material may include paraffin, for example, although some embodiments are not limited in this regard. The respective lengths (e.g., diameters) of ferromagnetic node structures 382 may, for example, be in a range of 30 nanometers (nm) to 30 microns—e.g., depending on implementation specific details.

Ferromagnetic body 370 may have at least some minimum volume fraction which is attributable to gap regions such as the illustrative gap regions 384 shown. In providing such a minimum volume fraction of gap regions (and a corresponding maximum volume fraction of all ferromagnetic material of the layer), some embodiments mitigate the possibility of the inductor being saturated during its operation. By way of illustration and not limitation, a volume fraction of ferromagnetic material in ferromagnetic body 370 may be equal to or less than 97%—e.g., wherein the volume fraction of gap regions is in a range of 3% to 25% (and, in some embodiments, in a range of 5% to 15%). It is understood that the total volume of ferromagnetic body 370 does not include the volume of other structures which are surrounded by ferromagnetic body 370—e.g., where such structures include portion 362c.

The volume fraction of gap regions 384 may be due at least in part to ferromagnetic node structures 382 comprising node structures of different sizes—e.g., wherein the respective sizes (for example, lengths) of ferromagnetic node structures 382 have a non-Gaussian distribution. By way of illustration and not limitation, ferromagnetic node structures 382 may consist of a combination of first ferromagnetic node structures having a first Gaussian size distribution and second ferromagnetic node structures having a second Gaussian size distribution. In such an embodiment, a difference—e.g., an absolute difference—between a first average of the first Gaussian size distribution and a second average of the second Gaussian size distribution may be at least 10% (in some embodiments, at least 20%) of the second average. Any of a variety of other combinations of two or more different sizes of ferromagnetic node structures may be implemented, in various embodiments.

Figure 4:
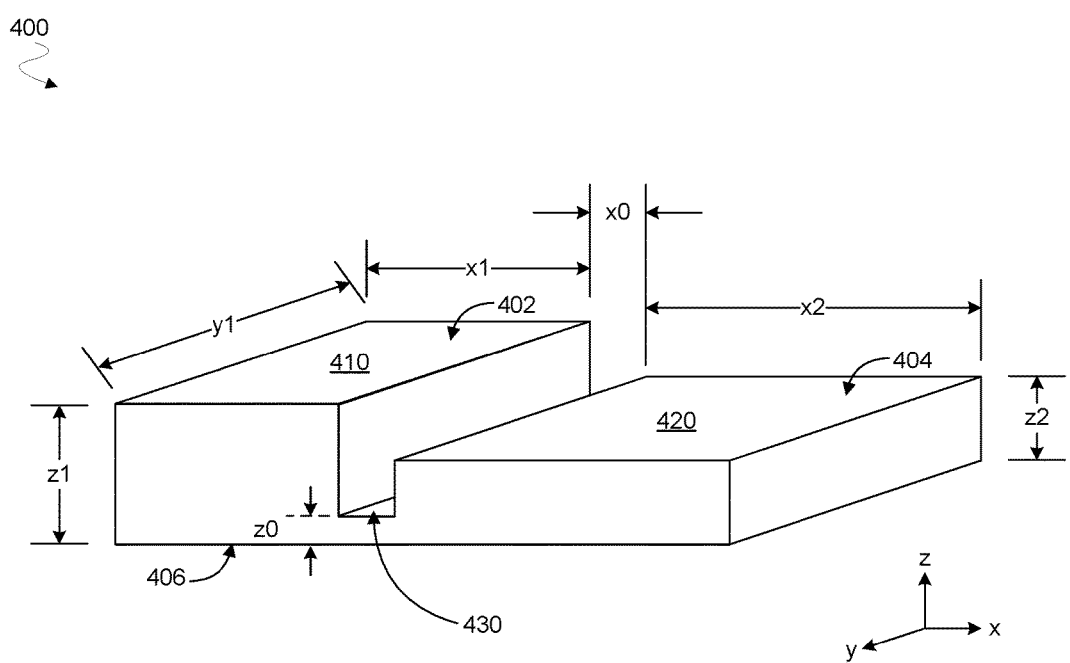
FIG. 4 illustrates circuit board structures to facilitate efficient heat dissipation by a circuit assembly according to an embodiment.

FIG. 4 shows features of a metal core 400 to facilitate efficient heat conduction in a circuit assembly according to an embodiment. Structures of metal core 400—which, for example, have some of all of the features of metal core 152—are not necessarily shown to scale or in relative proportion to one another. FIG. 4 illustrates one example of a metal core of a circuit board, the metal core including at least two portions, where respective surfaces of the portions extend in different planes—e.g., where a difference between the respective thicknesses of such portions is non-trivial (for example, not merely a result of manufacturing error). In providing portions that have different respective vertical spans, such a metal core may contribute to a difference in thermal conductivity characteristics between at least two regions of a circuit board.

Regarding physical structure of a metal core, "height" refers herein to a location or a structural dimension as determined with respect to a given line of direction, where—unless otherwise indicated—"area" refers to a span of a region (e.g., of a cross-sectional region or a surface region) in some plane which is orthogonal to that line of direction. That portion of the line of direction which is spanned by a given structure is referred to herein as the height (or alternatively, the "thickness") of that structure. A location at which a plane intersects such a line of direction, where the plane is orthogonal to that line of direction, is referred to herein as a height (or alternatively, "level") of that plane. A metal core may have one or more flat surfaces which extend each at a respective level along a height dimension. Unless otherwise indicated, "periphery" refers to an outermost edge of a given area.

With respect to metal core 400, "thickness" refers herein to any dimension measured in parallel to the z-axis of the xyz coordinate system shown. In one example embodiment, metal core 400 comprises at least two portions (e.g., including the illustrative first portion 410 and second portion 420 shown) which are each to provide a respective area on which circuit components may be variously disposed directly or indirectly. For example, first portion 410 and second portion 420 may each comprise at least five percent (5%)—and in some embodiments, at least 10%—of metal core 400 by volume.

To facilitate a variety of thermal conductivity characteristics, respective surfaces of first portion 410 and second portion 420 may extend at different respective heights along the z-axis—e.g., wherein, of first portion 410 and second portion 420, only a surface of one such portion extends in a given plane which is parallel to the x-y plane shown. For example, a surface 402 of first portion 410 and a surface 404 of second portion 420 may extend in planes at different respective levels. In such an embodiment, a difference between these levels may be at least 20%—and in some embodiments, at least 30%—of a maximum thickness of metal core 400 (i.e., where the difference is distinct from, and less than, the maximum thickness). By way of illustration and not limitation, the difference between such levels may be equal to an absolute difference value of $|(z1-z2)|$, where the maximum thickness of metal core 400 is equal to z1.

First portion 410 and second portion 420 may, in some embodiments, have different respective overall thicknesses as measured along the z-axis. For example, along a first periphery of first portion 410 (the first periphery spanning an area $x1 \cdot y1$), first portion 410 may have a first average thickness such as the illustrative thickness z1 shown—e.g., where along a second periphery of second portion 420 (e.g., the second periphery spanning an area $x2 \cdot y2$), second portion 420 has a second average thickness such as the illustrative thickness z2 shown. In such an embodiment, one of the first average thickness or the second average thickness may be at least two times the other of the first average thickness or the second average thickness. Although some embodiments are not limited in this regard, portions 410, 420 may have respective surfaces each extending in the same plane which is orthogonal to the height (z-axis) dimension. By way of illustration and not limitation, a surface 406 of metal core 400 may include both a bottom surface region of portion 410 and a bottom surface region of portion 420.

Although some embodiments are not limited in this regard, a first total area spanned by the first periphery of first portion 410 may be at least five percent (e.g., at least ten percent) of a largest cross-sectional area of the metal core. In such an embodiment, a second total area spanned by the second periphery of second portion 420 may be at least five percent (e.g., at least ten percent) of the largest cross-sectional area of the metal core. The largest cross-sectional area of the metal core may, for example, be equal to the product $[(x0+x1+x2) \cdot (y1)]$.

In some embodiments, at least one metal core portion (e.g., one of first portion 410 and second portion 420) forms a recess structure. Such a recess structure may serve as a reservoir for an adhesive, insulating material or any of various other substances to be disposed around one or more circuit components. A substance so contained by the reservoir may be distinguished, for example, from the package mold material of the packaged device.

Alternatively or in addition, an average thickness of all of first portion 410 may be at least two times an average thickness of all of second portion 420. Metal core 400 may further comprise one or more other portions (such as the illustrative portion 430 shown) to facilitate improved thermal insulation in the circuit board. By way of illustration and not limitation, metal core 400 may further comprise a portion 430 disposed between portions 410, 420—e.g., wherein portion 430 forms a trench structure having a length x0 and where an average height z0 of portion 430 is less than one of height z1 and height z2. For example, a difference between z0 and one of z1 or z2 may be at least 20%—and in some embodiments, at least 30%—of a maximum height of metal core 400. In such an embodiment, portion 430 may comprise at least 5% (for example, 10% or more) of metal core 400 by volume—e.g., where z1 is equal to z2, or where any difference between z1 and z2 is less than 20% of the maximum height of metal core 400. However, the particular number of such two or more metal core portions—and their particular configuration, dimensions, etc.—is merely illustrative. Metal core 400 may have more, fewer and/or differently configured portions to provide improved thermal insulation according to different embodiments. For example, metal 400 may omit portion 430 in other embodiments—e.g., wherein portions 410, 420 adjoin one another directly along the x-axis shown.

Metal core 400 may include copper, aluminum, brass and/or any of a variety of metals—e.g., including alloys—suitable for conducting heat (and, in some embodiments, to facilitate soldering and/or other electrical coupling). Formation of metal core 400 may include stamping, casting, cutting, grinding and/or other processes that, for example, are adapted from conventional techniques for forming metal core structures. In one example embodiment, an overall thickness (z-axis dimension) of metal core 400 is in a range of 0.15 millimeters (mm) to 0.6 mm—e.g., wherein an overall length (x-axis dimension) of metal core 400 is in a range of 10 mm to 30 mm and/or an overall width (y-axis dimension) of metal core 400 is in a range of 10 mm to 30 mm. However, such dimensions are merely illustrative, and may vary in different embodiments according to implementation-specific details.

Figure 5:
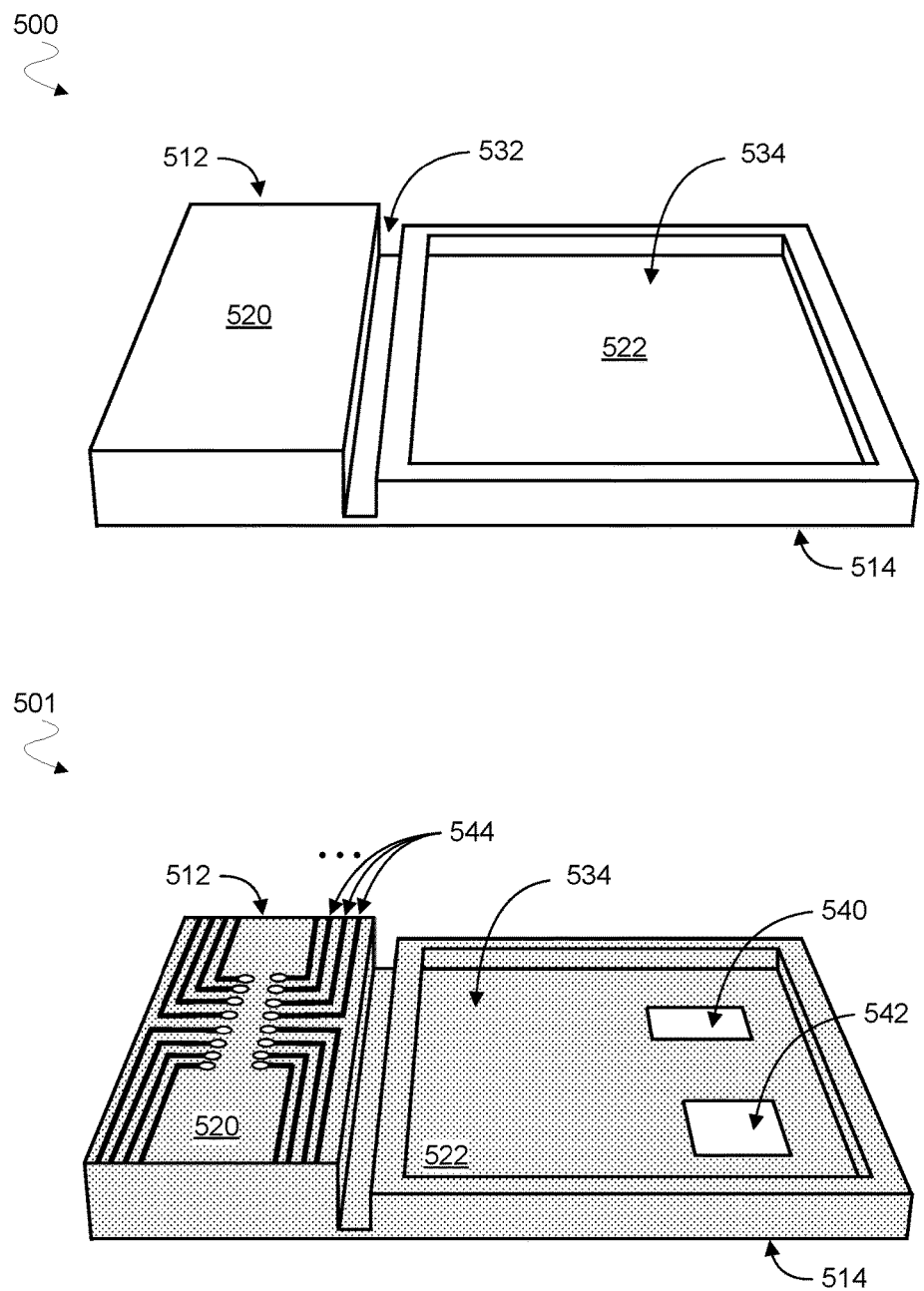
FIG. 5 shows respective structures each during a corresponding stage of processing to produce a circuit assembly according to an embodiment.

FIG. 5 shows stages 500, 501 of processing to provide a circuit board for a circuit assembly according to one embodiment. Such a circuit board may, for example, include features of circuit board 303—e.g., wherein the circuit board includes structure of metal core 152 and/or insulation material 154. Referring now stage 500, a stamping, machining sintering and/or other such processing of conductive material may result in the formation of a metal core including a portion 520 and a portion 522. Such a metal core may include one or more features of metal core 400, for example. In one illustrative embodiment shown, a height of a top surface of portion 522 may be below the height of a top surface of portion 520.

Although some embodiments are not limited in this regard, the metal core may form one or more recess structures each in a respective one of structures 520, 522. For example, portion 522 may be stamped, machined and/or otherwise shaped to from a recess 534 which extends into a side 512 of the metal core which is opposite a bottom side 514. Alternatively or in addition, the metal core may be further processed to a trench structure which is to provide at least partial thermal insulation between portions (e.g., portions 520, 522) which adjoin the trench structure. For example, a trench portion 532 may extend between portions 520, 522 on side 512. In some embodiments, the metal core may have formed therein multiple recess portions and/or multiple trench portions. In some embodiments, two or more recess structures and/or two or more trench structures are all on the same side (or alternatively, on opposite sides) of a metal core.

As illustrated by stage 501, fabrication of the circuit board may comprise depositing an insulator material on the metal core—e.g., including performing a patterned deposition which leaves one or more regions of the metal core exposed (e.g., such as the illustrative regions 540, 542 shown). Such regions 540, 542 may facilitate a soldering and/or other coupling of circuit structures to the metal core, where such coupling facilitates heat transfer to and/or from such circuit structures. A forming of conductive traces in or on the insulator material may, for example, include the formation of the illustrative traces 544 shown.

Figure 6:
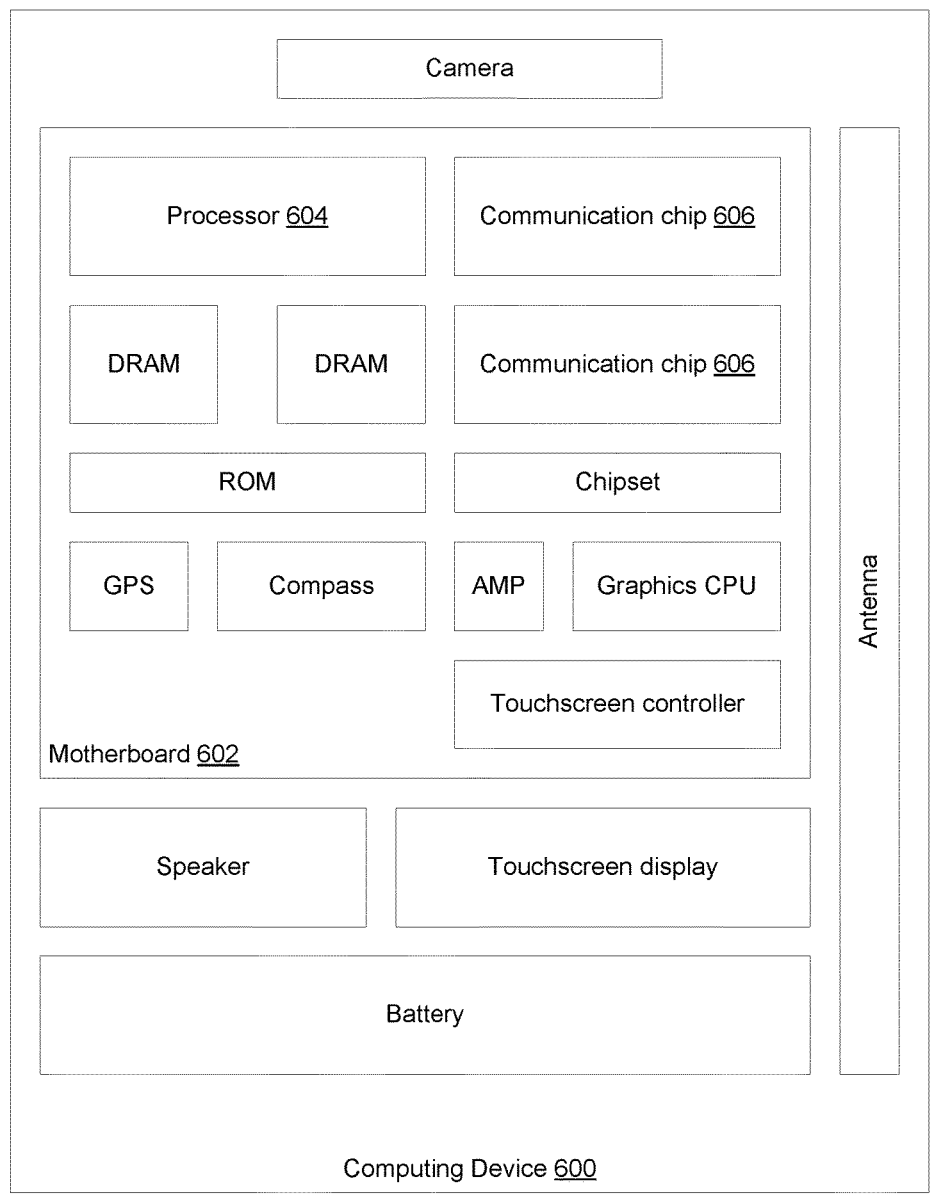
FIG. 6 is a functional block diagram illustrating elements of a computer device according to an embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
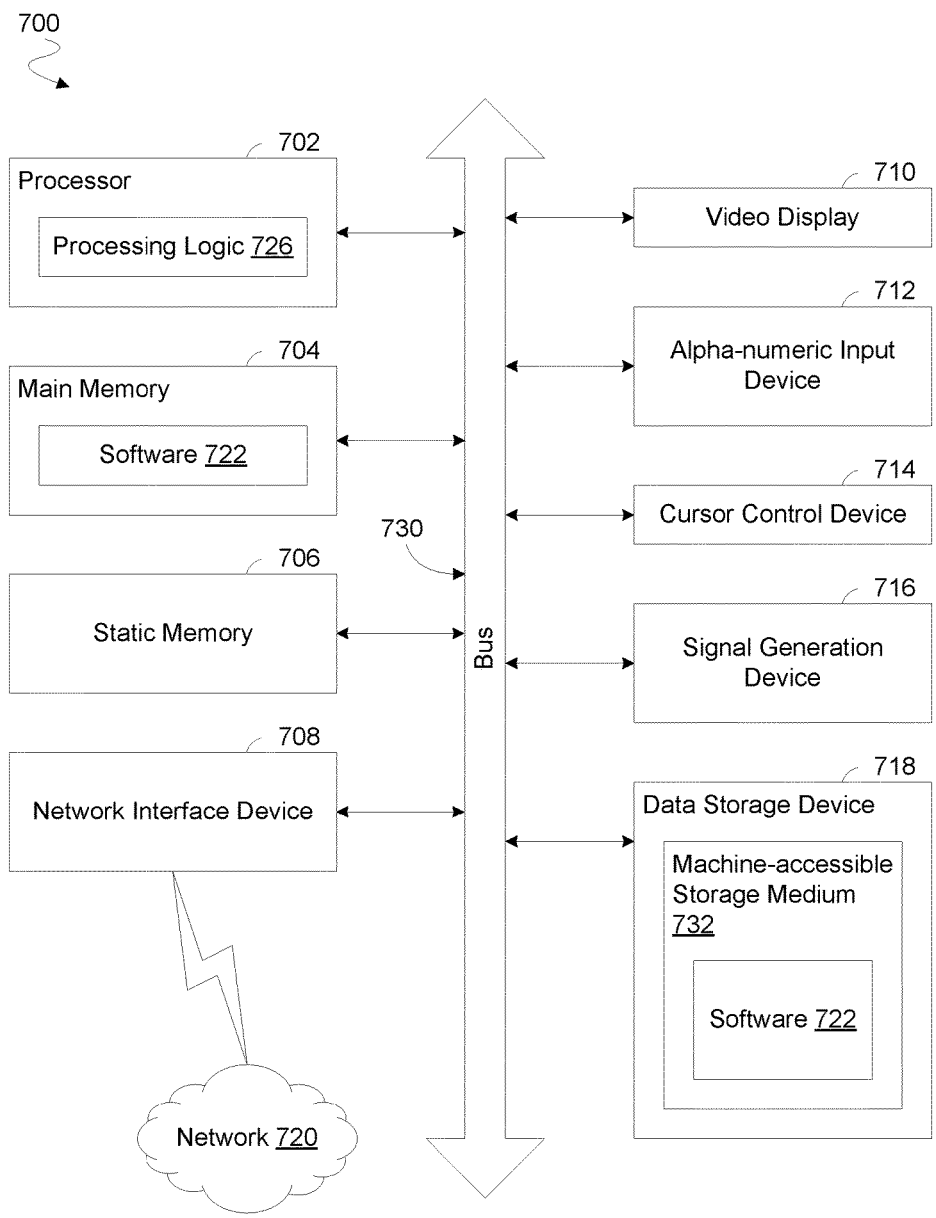
FIG. 7 is a functional block diagram illustrating elements of a computer system according to an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a circuit assembly comprises an inductor including a ferromagnetic body, and a first conductor which extends through the ferromagnetic body, wherein the first conductor forms fin structures on respective sides of the ferromagnetic body. The circuit assembly further comprises a packaged device coupled to the inductor, the packaged device including a circuit board, disposed in a package mold, comprising a metal core including a first core portion and a second core portion which each comprise at least five percent of the metal core by volume, wherein an average thickness of all of the first core portion and is at least two times an average thickness of all of the second core portion. The packaged device further comprises a circuit component disposed on the circuit board, and a second conductor and a third conductor each extending from the package mold, wherein the circuit component is electrically coupled across the inductor via the second conductor and the third conductor, wherein the metal core is thermally coupled to transfer heat from the circuit component to the first conductor via second conductor.

In one embodiment, one of the first core portion and the second core portion forms a recess structure. In another embodiment, the metal core forms a trench structure between the first core portion and the second core portion. In another embodiment, the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor. In another embodiment, for one of the one of the first terminal and the second terminal, a length of the terminal is at least two times a width of the terminal. In another embodiment, the first terminal is disposed between the ferromagnetic body and the first fin structures. In another embodiment, a volume fraction of a ferromagnetic material of the ferromagnetic body is equal to or less than ninety seven percent (97%). In another embodiment, some or all of the fin structures extend to overlap a sidewall of the packaged device. In another embodiment, the package mold forms a sidewall which extends around a periphery of the packaged device, wherein respective distal ends of a plurality of leads of the packaged device each extend to a region of the sidewall between a first plane and a second plane parallel to the first plane, wherein the second plane is between the first plane and a portion of a first lead of the plurality of leads.

In another implementation, a method comprises coupling a first conductor of an inductor to a second conductor of a packaged device, wherein the first conductor extends through a ferromagnetic body of the inductor, wherein the first conductor forms fin structures on respective sides of the ferromagnetic body, wherein the packaged device includes a circuit board disposed in a package mold and a circuit component disposed on the circuit board, wherein the second conductor and a third conductor of the packaged device each extend from the package mold. The method further comprises coupling the first conductor to the third conductor, wherein the circuit component is electrically coupled across the inductor via the second conductor and the third conductor, wherein the circuit board comprises a metal core including a first core portion and a second core portion which each comprise at least five percent of the metal core by volume, wherein an average thickness of all of the first core portion and is at least two times an average thickness of all of the second core portion, wherein the metal core is thermally coupled to transfer heat from the circuit component to the first conductor via second conductor.

In one embodiment, one of the first core portion and the second core portion forms a recess structure. In another embodiment, the metal core forms a trench structure between the first core portion and the second core portion. In another embodiment, the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor. In another embodiment, for one of the one of the first terminal and the second terminal, a length of the terminal is at least two times a width of the terminal. In another embodiment, the first terminal is disposed between the ferromagnetic body and the first fin structures. In another embodiment, a volume fraction of a ferromagnetic material of the ferromagnetic body is equal to or less than ninety seven percent (97%). In another embodiment, some or all of the fin structures extend to overlap a sidewall of the packaged device. In another embodiment, the package mold forms a sidewall which extends around a periphery of the packaged device, wherein respective distal ends of a plurality of leads of the packaged device each extend to a region of the sidewall between a first plane and a second plane parallel to the first plane, wherein the second plane is between the first plane and a portion of a first lead of the plurality of leads.

In another implementation, a system comprises circuit assembly including an inductor comprising a ferromagnetic body and a first conductor which extends through the ferromagnetic body, wherein the first conductor forms fin structures on respective sides of the ferromagnetic body. The system further comprises a packaged device coupled to the inductor, the packaged device including a circuit board, disposed in a package mold, comprising a metal core including a first core portion and a second core portion which each comprise at least five percent of the metal core by volume, wherein an average thickness of all of the first core portion and is at least two times an average thickness of all of the second core portion. The packaged device further comprises a circuit component disposed on the circuit board, and a second conductor and a third conductor each extending from the package mold, wherein the circuit component is electrically coupled across the inductor via the second conductor and the third conductor, wherein the metal core is thermally coupled to transfer heat from the circuit component to the first conductor via second conductor. The system further comprises a display device coupled to the circuit assembly, the display device configured to display an image based on a signal or a voltage communicated between the inductor and the packaged device.

In one embodiment, one of the first core portion and the second core portion forms a recess structure. In another embodiment, the metal core forms a trench structure between the first core portion and the second core portion. In another embodiment, the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor. In another embodiment, for one of the one of the first terminal and the second terminal, a length of the terminal is at least two times a width of the terminal. In another embodiment, the first terminal is disposed between the ferromagnetic body and the first fin structures. In another embodiment, a volume fraction of a ferromagnetic material of the ferromagnetic body is equal to or less than ninety seven percent (97%). In another embodiment, some or all of the fin structures extend to overlap a sidewall of the packaged device. In another embodiment, the package mold forms a sidewall which extends around a periphery of the packaged device, wherein respective distal ends of a plurality of leads of the packaged device each extend to a region of the sidewall between a first plane and a second plane parallel to the first plane, wherein the second plane is between the first plane and a portion of a first lead of the plurality of leads.

Techniques and architectures for improving heat dissipation with a circuit assembly are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A circuit assembly comprising:
    an inductor including:
        a ferromagnetic body; and
        a first conductor which extends through the ferromagnetic body, wherein the first conductor forms fin structures on respective sides of the ferromagnetic body; and
    a packaged device coupled to the inductor, the packaged device including:
        a circuit board, disposed in a package mold, comprising a metal core including a first core portion and a second core portion which each comprise at least five percent of the metal core by volume, wherein an average thickness of all of the first core portion is at least two times an average thickness of all of the second core portion;
        a circuit component disposed on the circuit board; and
        a second conductor and a third conductor each extending from the package mold, wherein the circuit component is electrically coupled across the inductor via the second conductor and the third conductor, wherein the metal core is thermally coupled to transfer heat from the circuit component to the first conductor via the second conductor.

2. The circuit assembly of claim 1, wherein one of the first core portion and the second core portion forms a recess structure.

3. The circuit assembly of claim 1, wherein the metal core forms a trench structure between the first core portion and the second core portion.

4. The circuit assembly of claim 1, wherein the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor.

5. The circuit assembly of claim 4, wherein, for one of the first terminal and the second terminal, a length of the terminal is at least two times a width of the terminal.

6. The circuit assembly of claim 4, wherein the first terminal is disposed between the ferromagnetic body and the first fin structures.

7. The circuit assembly of claim 1, wherein a volume fraction of a ferromagnetic material of the ferromagnetic body is equal to or less than ninety seven percent (97%).

8. The circuit assembly of claim 1, wherein some or all of the fin structures extend to overlap a sidewall of the packaged device.

9. The circuit assembly of claim 1, wherein the package mold forms a sidewall which extends around a periphery of the packaged device, wherein respective distal ends of a plurality of leads of the packaged device each extend to a region of the sidewall between a first plane and a second plane parallel to the first plane, wherein the second plane is between the first plane and a portion of a first lead of the plurality of leads.

10. A method comprising:
    coupling a first conductor of an inductor to a second conductor of a packaged device, wherein the first conductor extends through a ferromagnetic body of the inductor, wherein the first conductor forms fin structures on respective sides of the ferromagnetic body, wherein the packaged device includes a circuit board disposed in a package mold and a circuit component disposed on the circuit board, wherein the second conductor and a third conductor of the packaged device each extend from the package mold; and
    coupling the first conductor to the third conductor, wherein the circuit component is electrically coupled across the inductor via the second conductor and the third conductor, wherein the circuit board comprises a metal core including a first core portion and a second core portion which each comprise at least five percent of the metal core by volume, wherein an average thickness of all of the first core portion is at least two times an average thickness of all of the second core portion, wherein the metal core is thermally coupled to transfer heat from the circuit component to the first conductor via the second conductor.

11. The method of claim 10, wherein the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor.

12. The method of claim 11, wherein, for one of the first terminal and the second terminal, a length of the terminal is at least two times a width of the terminal.

13. The method of claim 11, wherein the first terminal is disposed between the ferromagnetic body and the first fin structures.

14. The method of claim 10, wherein some or all of the fin structures extend to overlap a sidewall of the packaged device.

15. A system comprising:
    circuit assembly including:
        an inductor comprising:
            a ferromagnetic body; and a first conductor which extends through the ferromagnetic body, wherein the first conductor forms fin structures on different respective sides of the ferromagnetic body; and a packaged device coupled to the inductor, the packaged device including:

a circuit board, disposed in a package mold, comprising a metal core including a first core portion and a second core portion which each comprise at least five percent of the metal core by volume, wherein an average thickness of all of the first core portion is at least two times an average thickness of all of the second core portion;

a circuit component disposed on the circuit board; and a second conductor and a third conductor each extending from the package mold, wherein the circuit component is electrically coupled across the inductor via the second conductor and the third conductor, wherein the metal core is thermally coupled to transfer heat from the circuit component to the first conductor via the second conductor; and a display device coupled to the circuit assembly, the display device configured to display an image based on a signal or a voltage communicated between the inductor and the packaged device.

16. The system of claim 15, wherein one of the first core portion and the second core portion forms a recess structure.

17. The system of claim 15, wherein the metal core forms a trench structure between the first core portion and the second core portion.

18. The system of claim 15, wherein the first conductor includes a first portion, a second portion, and a third portion disposed between the first portion and second portion, wherein the ferromagnetic body extends around the third portion, wherein the first portion forms first structures, wherein the second portion forms second fin structures, wherein the first portion has formed thereon a first terminal coupled to the second conductor and wherein the second portion has formed thereon a second terminal coupled to the third conductor.

19. The system of claim 18, wherein the first terminal is disposed between the ferromagnetic body and the first fin structures.

20. The system of claim 15, wherein some or all of the fin structures extend to overlap a sidewall of the packaged device.

* * * * *